(12) United States Patent
Cavaluzzi et al.

(10) Patent No.: US 7,075,303 B2
(45) Date of Patent: Jul. 11, 2006

(54) POLYMERIC NMR SAMPLE TUBES AND METHOD FOR USING

(75) Inventors: Michael J. Cavaluzzi, Tully, NY (US); Philip N. Borer, Chittenango, NY (US)

(73) Assignee: Syracuse University, Syracuse, NY (US)

( * ) Notice: Subject to any disclaimer, the term of this patent is extended or adjusted under 35 U.S.C. 154(b) by 0 days.

(21) Appl. No.: 10/902,770

(22) Filed: Jul. 30, 2004

(65) Prior Publication Data

US 2005/0024055 A1 Feb. 3, 2005

Related U.S. Application Data

(60) Provisional application No. 60/491,191, filed on Jul. 30, 2003.

(51) Int. Cl.
*G01V 3/00* (2006.01)
(52) U.S. Cl. ..................................................... 324/321
(58) Field of Classification Search ................ 324/321, 324/318, 307, 312, 300
See application file for complete search history.

(56) References Cited

U.S. PATENT DOCUMENTS 4,654,592 A * 3/1987 Zens ........................... 324/307
4,940,942 A * 7/1990 Bartuska et al. ............. 324/321
6,054,857 A * 4/2000 Doty ........................... 324/321

* cited by examiner

*Primary Examiner*—Louis Arana
(74) *Attorney, Agent, or Firm*—Pastel Law Firm; Christopher R. Pastel

(57) ABSTRACT

A nuclear magnetic resonance (NMR) sample tube is made of a polymeric material instead of glass. Such tubes are thinner than glass tubes, thus increasing the internal volume and sample size. Such tubes are also more closely matched to the magnetic susceptibility of specific solvents. Such tubes have greater mechanical stability, thus leading to less tube breakage during NMR processing. Such tubes also lend themselves to various concentric tubal arrangements which permit separation and mixing of samples to minimize subtraction artifacts in interacting systems.

28 Claims, 14 Drawing Sheets

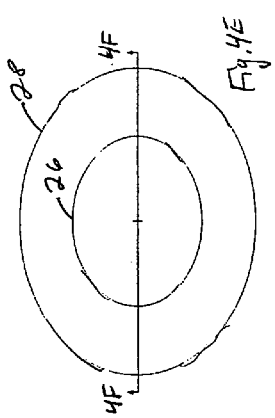
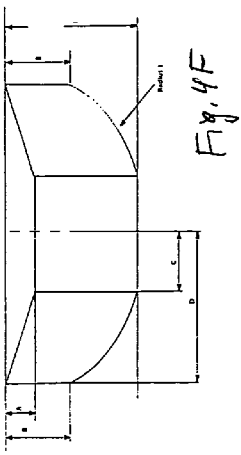
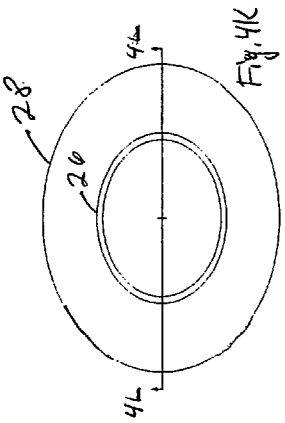
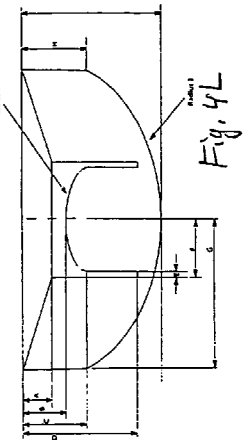
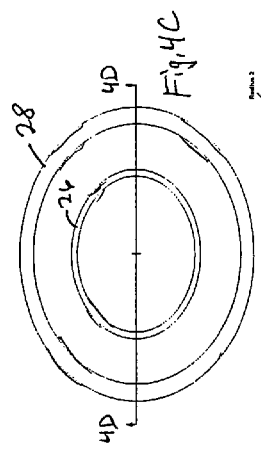
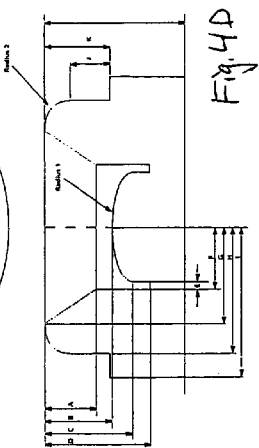
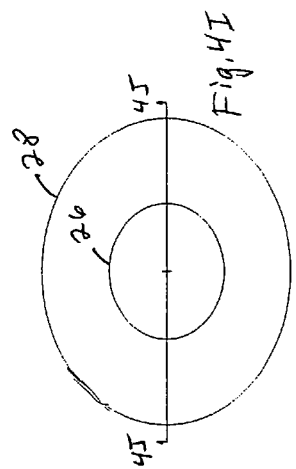
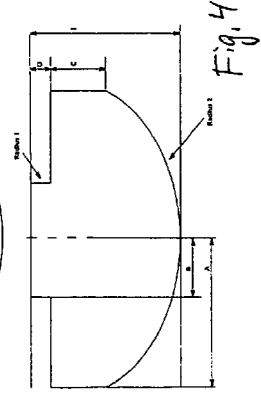
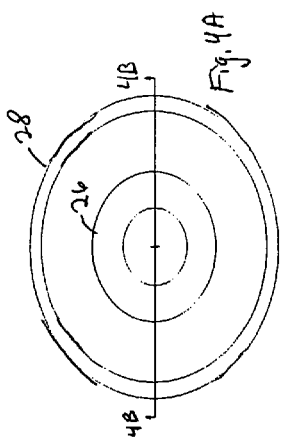
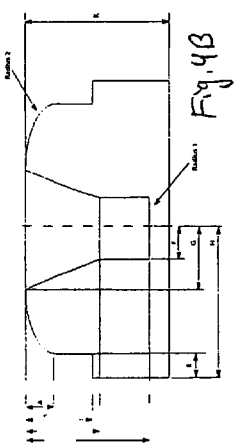
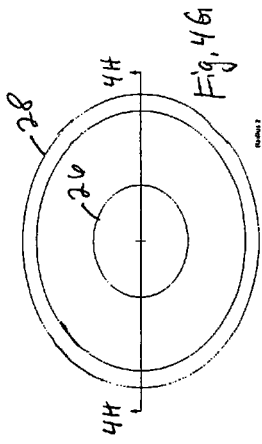
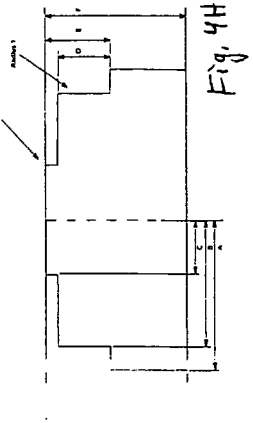

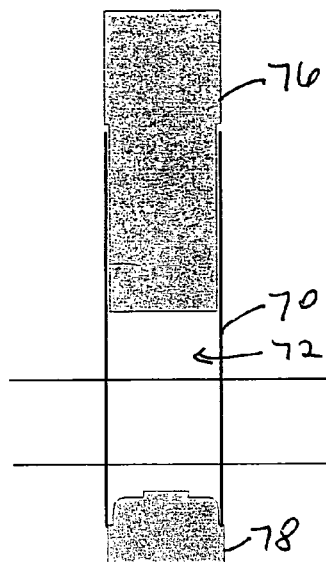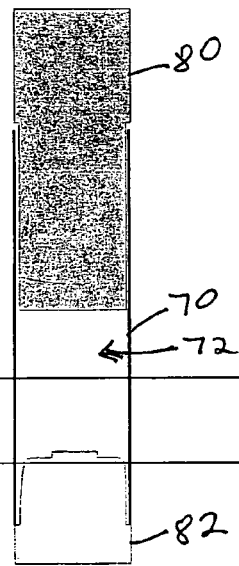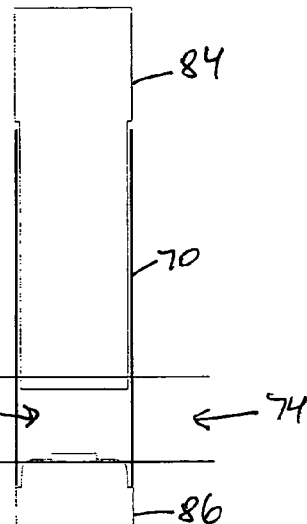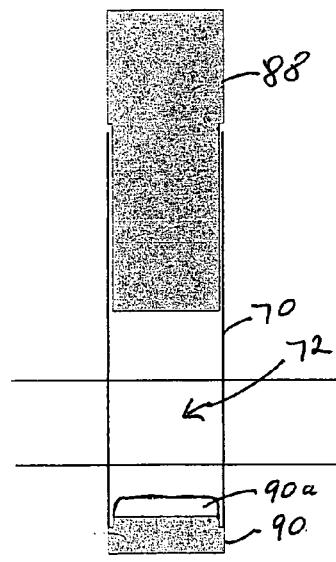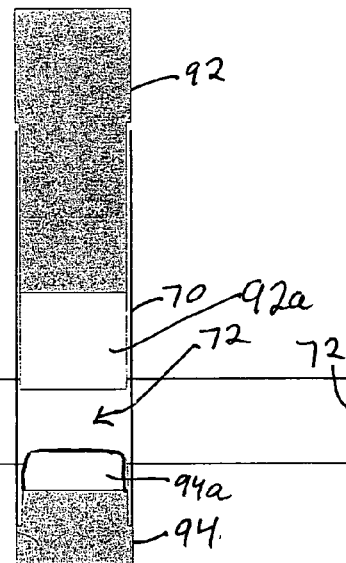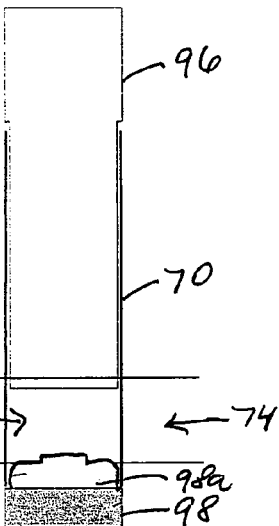

POLYMERIC NMR SAMPLE TUBES AND METHOD FOR USING

CROSS-REFERENCE TO RELATED APPLICATIONS

This application claims priority from U.S. Provisional Application Ser. No. 60/491,191 filed Jul. 30, 2003 entitled POLYMERIC NMR SAMPLE TUBES & METHOD FOR USING, incorporated herein by reference.

FIELD OF THE INVENTION

This invention relates generally to the field of nuclear magnetic resonance (NMR), and more particularly to polymeric sample tubes used with NMR testing.

BACKGROUND OF THE INVENTION

Nuclear magnetic resonance ("NMR") is one of the most widely used analytical techniques in chemistry and structural biology. It is an essential tool in drug discovery and design and has a tremendous variety of applications in chemistry, biochemistry and engineering.

A typical 600 MHz NMR magnet includes several miles of superconducting wire to form a nearly perfect solenoid close to the center of the cryostat. At liquid helium temperature the solenoid supports an extremely high electrical current that creates a large and uniform magnetic field. A sample tube rides a stream of air from the top of the magnet to roughly the center of the magnet. The bottom of the sample tube is positioned within the top of the "probehead" that bears a small coil to induce and detect transitions between the spin states of protons, carbon-13, nitrogen-15, or other nuclei of interest. A brief, intense radiofrequency pulse (~10 µs) at 600 MHz generated by the probehead is needed to excite proton spins; other nuclei can be excited at other frequencies. A short time after the pulse, the same coil is used to detect the decay of the spins back to their equilibrium state. The voltage induced in the coil is amplified and transformed to a display of peaks in a spectrum. The dispersion of peaks and their individual characteristics in a spectrum provide rapid feedback to a chemist regarding chemical composition, relative concentration, and purity in a sample. More extended analysis is required to determine details of three-dimensional structure, dynamics, and the stability of complexes.

A typical NMR spectrometer process involves placing a liquid sample into a long (18–25 cm), thin (4.97 mm outer diameter), high-precision glass sample tube that is then suspended vertically inside a close-fitting core in the NMR's intense magnetic field. The air gap between the glass sample tube and the surrounding core is typically only 0.300 mm. The tube with sample is then usually spun axially, typically at 20 Hz, to provide an average view of the sample to the NMR detectors and lessen the effect of imperfect magnetic field homogeneity. While the NMR measures the spectra of the sample, the magnetic lines of force are unfortunately distorted by the glass sample tube because all undoped glasses have bulk magnetic susceptibilities that are not well matched to the bulk magnetic susceptibilities of chemical and biological solvents normally used in NMR experiments. These discontinuities introduce unwanted spectral artifacts that should be minimized, if possible, by the skilled researcher. To reduce this problem, the glass tube walls are made as thin as practicable (typically ranging downward from 0.38–0.22 mm, with special case applications of 0.19 mm known) to reduce the amount of glass present, constrained by the need to avoid breakage and losing the sample, especially inside the NMR magnet. Spectral artifacts can become severe unless the tube walls are extremely uniform in thickness, precisely cylindrical and almost perfectly straight (this also helps to avoid potentially expensive damage to the instrumentation). High precision glass sample tubes are thus a substantial part of the cost of operating an NMR spectrometer.

SUMMARY OF THE INVENTION

Briefly stated, the invention is the novel use of a group of polymeric materials, rather than customary glasses, in the fabrication of otherwise standard sample tubes used for nuclear magnetic resonance (NMR) spectroscopy. These thin-walled NMR tubes are designed for standard liquid-state high resolution probeheads in common use for chemical and biochemical applications. They are designed to be used at ambient pressure, spinning or non-spinning conditions, and require no modification to standard probeheads. This novelty permits advantageous methods of configuring when using such tubes and other advantages disclosed below.

It is an object of the invention to fabricate NMR sample tubes from a group of polymeric materials that avoid all of the named disadvantages of glass sample tubes. It is a further object of the invention to provide benefits which are otherwise unavailable: matched bulk magnetic susceptibilities with advantageous gains in spectra quality and spectra acquisition speed, reduction in tube expense, substantial increase in the active sample volume (which increases spectroscopic sensitivity), substantial elimination of tube breakage, improved recoverability of samples from ultrasmooth and possibly hydrophobic tubes, improved dimensional reduction for capillary tubes used in standard temperature (70° C.–1° C.) as well low temperature (<0° C.) experimentation , more convenient provision and greater variability for reference samples in thin-wall concentric tubes, and greater productivity in mixing samples in situ using concentric tubes. The present invention is not limited to the "5-mm" tubes described in the previous paragraph. The advantages can apply to all sample tubes that are 10 mm outer diameter or less.

Specific advantages include: (1) magnetic susceptibility matching for specific solvents to facilitate rapid acquisition of high-quality spectra, (2) inexpensive fabrication to cut costs to a fraction of existing high-precision glass tubes, (3) a substantial increase in the active volume within the transmitter/receiver coil of the NMR probehead to increase sensitivity, (4) greater mechanical stability to eliminate breakage associated with fragile glass tubes, (5) less adhesion between water and the sample tubes to facilitate recovery of precious samples, (6) removable concentric tubes with matched susceptibility to improve chemical shift referencing and enable routine and accurate concentration determination, and (7) a separation/mixing apparatus to minimize subtraction artifacts in drug/target surveys and for other interacting systems.

The invention includes NMR sample tubes made from a material selected from a group of polymeric materials which include polymers with a bulk magnetic susceptibility, or chi factor, $\chi$, that is within 5% of both the unadulterated solvent $\chi$ value as well as the (sample+solvent) $\chi$ value. In a preferred embodiment for aqueous-solvated, dimethylsulfoxide-solvated, and chloroform-solvated samples, the material selected is ULTEM® (polyetherimide/GE Plastics), RYTON® (polyphenylene sulfide/Phillips), KAPTON® (polyimide/Dupont), or PEEK® (polyetheretherketone, Victrex), all readily available commercial plastics. The invention further includes NMR sample tubes having uniform wall thicknesses selected from a range from 0.02 mm to 0.33 mm in the region of the sample tube detectable by the NMR probehead. In the preferred embodiment, this is along the last 50–80 mm of the distal end of the tube, and designed to be 62 mm. For smaller OD tubes, <3 mm, the tube wall thickness may be as thin as 0.007–0.02 mm.

The invention further includes NMR sample tubes having a formed-closed end or a distal sealing plug. Such distal sealing plug is made from a material selected from a group of polymeric materials including polymers that are within 5% of both the unadulterated solvent $\chi$ value as well as the (sample+solvent) $\chi$ value. In the preferred embodiment for aqueous samples, the material selected is polyimide or polyetheretherketone, although a material with suitable $\chi$ may be selected that differs from the material composition of the sample outer tube. A layering combination of materials may be used that exploits improved sealing capabilities from one layer and another layer with matched $\chi$ composition that is in direct exposure to the sample proximal or encroaching upon the RF coil. Lastly, there is the possibility that $\chi$ matched materials may be used that are deposited onto or are surface coated upon other materials. Such distal sealing plugs may be permanently fixed to such sample tube by a bonding means comprising adhesives or welding, be removably held in place by means comprising friction or surface tension forces, or by O-ring seal devices. Such distal sealing plugs may incorporate a positioning means to concentrically position and seal at least one inner tube that is either independently sealed with thin layer adhesive or sealed by a bottom distal plug made of suitable $\chi$ material, as previously defined, inside such sample tube. Such positioning means for such inner tube may permanently or removably attach such inner tube to such distal sealing plug, whether or not the outer sample tube is permanently or removably attached to such distal sealing plug. The invention includes such an inner tube to contain a segregated reference sample for NMR comparison with the sample contained by the outer sample tube. The invention further includes such an inner tube to contain a liquid that mixes with the sample contained by the outer sample tube when such inner tube is pulled from its position in the distal sealing plug. Another mixing embodiment involves samples being drawn from all tube compartment sample chambers, mixed, and then re-injected to occupy the sample chambers so as to maintain the total number of nuclear spins nearly identical to that of initial starting conditions. The sample chambers can be drawn upwards through chamber passage holes fabricated within the positioning rod or downwards through sample chamber passage holes fabricated as part of the distal sealing plug.

According to an embodiment of the invention, a nuclear magnetic resonance (NMR) sample apparatus includes a sample tube; wherein the sample tube is made from a polymeric material.

According to a feature of the invention, in the NMR sample apparatus, the polymeric material is selected from the group of polymeric materials which have a bulk magnetic susceptibility (chi factor) that is within five percent of both a chi factor of an unadulterated solvent and a chi factor of a combination of the solvent and a sample.

According to a feature of the invention, in the NMR sample apparatus, the solvent is selected from the group consisting of water, heavy water, dimethylsulfoxide, and chloroform, and the sample is selected from the group consisting of an aqueous-solvated sample and a chloroform-solvated sample, and the polymeric material is selected from the group consisting of polyetherimide, polyphenylene sulfide, polyetheretherketone, and polyimide.

According to an embodiment of the invention, a nuclear magnetic resonance (NMR) sample apparatus includes a sample tube; wherein the sample tube is made from a material selected from the group of polymeric materials which have a bulk magnetic susceptibility (chi factor) that is within five percent of both a chi factor of an unadulterated solvent and a chi factor of a combination of the solvent and a sample; a positioning rod in a proximate end of the sample tube; and an endcap in a distal end of the sample tube, wherein, when the sample is contained in the sample tube, bounded on one side by the positioning rod and bounded on another side by the endcap, and the sample is placed within a NMR detection area, when the positioning rod is proximate the NMR detection area, the positioning rod has a chi factor that is within five percent of both the chi factor of the unadulterated solvent and the chi factor of the combination of the solvent and the sample, and when the endcap is proximate the NMR detection area, the endcap has a chi factor that is within five percent of both the chi factor of the unadulterated solvent and the chi factor of the combination of the solvent and the sample.

According to an embodiment of the invention, a method of matching a bulk magnetic susceptibility (chi factor) of an NMR sample apparatus and a sample within a NMR process includes the steps of (a) solvating the sample with a solvent; (b) providing a sample tube; wherein the sample tube is made from a material selected from the group of polymeric materials which have a bulk magnetic susceptibility (chi factor) that is within five percent of both a chi factor of the unadulterated solvent and a chi factor of the solvated sample; (c) inserting an endcap in a distal end of the sample tube, (d) inserting the solvated sample in the sample tube; (e) inserting a positioning rod in a proximate end of the sample tube; (f) placing the solvated sample within the sample tube within a NMR detection area; (g) maximizing instrumental sensitivity of the NMR process by ensuring that when the positioning rod is proximate the NMR detection area, the positioning rod has a chi factor that is within five percent of both the chi factor of the unadulterated solvent and the chi factor of the solvated sample, and by ensuring that when the endcap is proximate the NMR detection area, the endcap has a chi factor that is within five percent of both the chi factor of the unadulterated solvent and the chi factor of the solvated sample.

According to an embodiment of the invention, a method of testing a sample using nuclear magnetic resonance (NMR) includes the steps of (a) providing a sample apparatus which includes an inner sample tube and an outer sample tube; wherein the inner and outer sample tubes are made from a material selected from the group of polymeric materials which have a bulk magnetic susceptibility (chi factor) that is within five percent of a chi factor of the sample; (b) inserting a calibration reference material in the inner tube; (c) inserting the sample in the outer tube; (d) performing calibration testing on the sample apparatus; (e) removing the inner tube and calibration reference material after the step of performing calibration testing; and (f) scanning the sample in the outer tube, after the step of removing, using NMR.

According to an embodiment of the invention, a method of testing using nuclear magnetic resonance (NMR) in an NMR machine includes the steps of (a) providing a sample apparatus which includes an inner sample tube and an outer sample tube; wherein the inner and outer sample tubes are made from a material selected from the group of polymeric materials which have a bulk magnetic susceptibility (chi factor) that is within five percent of a chi factor of the sample; (b) inserting a first sample material in the inner tube; (c) inserting a second sample material in the outer tube; (d) performing calibration testing on the sample apparatus using NMR; (e) removing, after the step of performing calibration testing, the first sample material from the inner tube and the second sample material from the second tube; (f) mixing the first and second sample materials; (g) inserting the mixed first and second sample materials into the inner and outer tubes; and (h) scanning the mixed sample materials using NMR; wherein the sample apparatus remains in the NMR machine at least during the steps (d), (e), (f), (g), and (h).

BRIEF DESCRIPTION OF THE DRAWINGS

FIG. 4A shows a top view of a configuration for an endcap according to an embodiment of the invention.

FIG. 4B shows a cross-sectional view taken along the line 4B—4B in the embodiment of FIG. 4A.

FIG. 4C shows a top view of a configuration for an endcap according to an embodiment of the invention.

FIG. 4D shows a cross-sectional view taken along the line 4D—4D in the embodiment of FIG. 4C.

FIG. 4E shows a top view of a configuration for an endcap according to an embodiment of the invention.

FIG. 4F shows a cross-sectional view taken along the line 4F—4F in the embodiment of FIG. 4E.

FIG. 4G shows a top view of a configuration for an endcap according to an embodiment of the invention.

FIG. 4H shows a cross-sectional view taken along the line 4H—4H in the embodiment of FIG. 4G.

FIG. 4I shows a top view of a configuration for an endcap according to an embodiment of the invention.

FIG. 4J shows a cross-sectional view taken along the line 4J—4J in the embodiment of FIG. 4I.

FIG. 4K shows a top view of a configuration for an endcap according to an embodiment of the invention.

FIG. 4L shows a cross-sectional view taken along the line 4L—4L in the embodiment of FIG. 4K.

FIGS. 9A–9F show embodiments of tubes with plugs of materials employed to occupy the sample transfer spaces so as to create a continuous layer of magnetically equivalent material.

DETAILED DESCRIPTION OF THE PREFERRED EMBODIMENT

Any technical terms and abbreviations, not explicitly defined below, are to be construed with their ordinary meaning as understood by one of skill in the art of high resolution nuclear magnetic resonance spectroscopy. In addition, the attached research plan from the Phase II grant application (pages 25–47, as redacted) to the National Institutes of Health Small Business Technology Transfer Research program (Michael J. Cavaluzzi, Principal Investigator, NIH 2 R42 RR018442-02) is incorporated in its entirety in this patent application. The references cited on pages 46 and 47 of the Phase II grant application are also incorporated herein by reference.

Figure 1A:
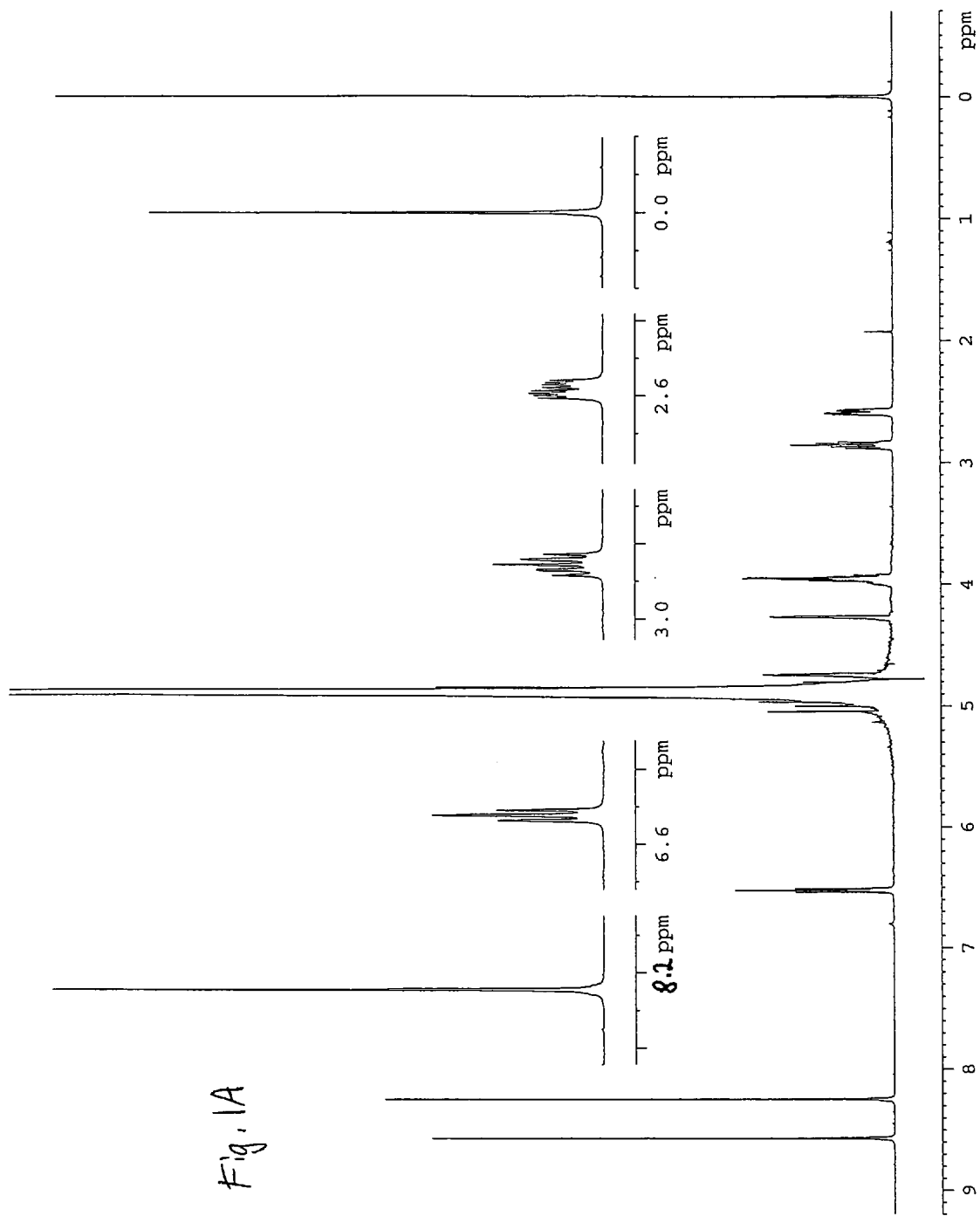
FIG. 1A shows the detected induced voltage amplified and transformed to a display of peaks in a spectrum as a result of NMR.
Figure 1B:
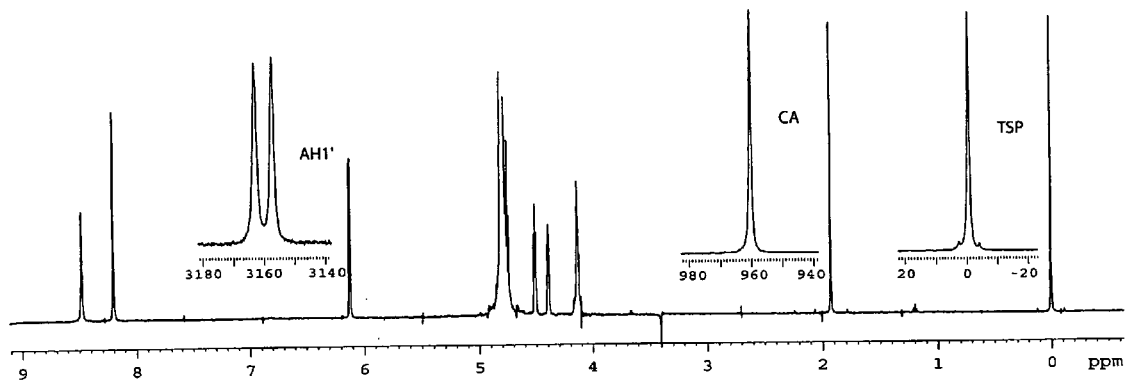
FIG. 1B shows the spectrum of a sample containing 5'AMP: adenosine-5'-monophosphate, CA: cacodylic acid, and TSP [3-(trimethylsilyl)propionic-2,2,3,3-$d_4$ acid sodium salt] dissolved in 99.996% $D_2O$.
Figure 1C:
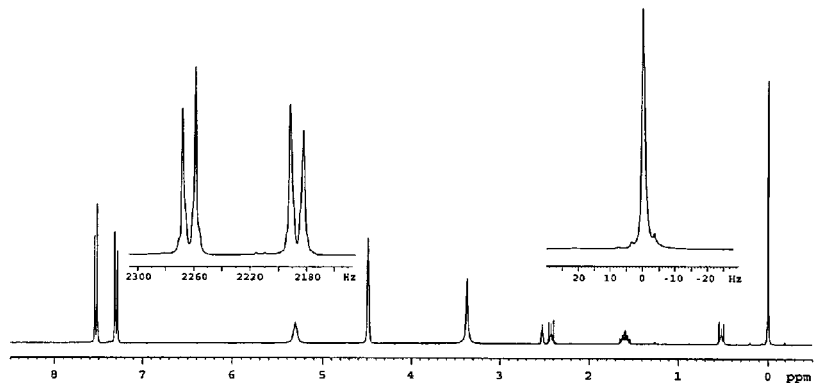
FIG. 1C shows the spectrum of 4-Bromobenzylalcohol and DSS in DMSO.
Figure 1D:
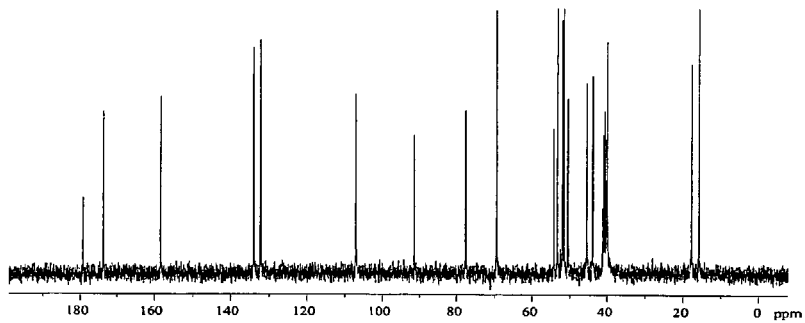
FIG. 1D shows the Gibberellic acid $^{13}$C-NMR spectrum in $CDCl_3$.

Sample Active Volume. Referring to FIGS. 1A–1C, the detected induced voltage amplified and transformed to a display of peaks in a spectrum as a result of NMR is shown. A typical NMR spectrometer employs a solenoid at liquid helium temperatures, permitting an extremely high electrical current to flow through the solenoid and create a large and uniform magnetic field. A sample tube is precisely suspended and usually spun at 20 Hz in this powerful magnetic field. The distal end of the sample tube containing the liquid sample is surrounded by another, smaller coil. This radiofrequency (RF) coil is tuned for optimal performance at the "Larmor" resonance frequency for the nucleus of interest at the magnetic field strength of the main solenoid. For protons, the RF frequency is often 300–900 MHz in currently used NMR spectrometers. The RF coil is held close to the sample within a removable probehead. The RF coil emits a very intense and brief (typically 10 microseconds) radiofrequency pulse into the sample, exciting the spins of interest in the sample. The decay of the spins back to their equilibrium state then induces a voltage oscillation in the same RF coil. This detected induced voltage is amplified and transformed to a display of peaks in a spectrum as shown in FIG. 1A. The dispersion of peaks and their individual characteristics in a spectrum indicate to a chemist the sample's chemical composition, relative concentration and chemical purity. FIG. 1B shows the spectrum of a sample containing 5'AMP: adenosine-5'-monophosphate, CA: cacodylic acid, and TSP [3-(trimethylsilyl)propionic-2,2,3,3-$d_4$ acid sodium salt] dissolved in 99.996% $D_2O$. FIG. 1C shows the spectrum of 4-Bromobenzylalcohol and DSS in DMSO. FIG. 1D shows the Gibberellic acid $^{13}C$-NMR spectrum in $CDCl_3$.

Figures 1E, 1F:
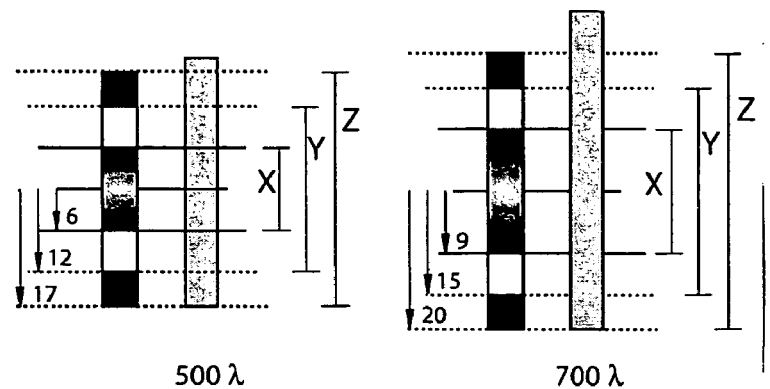
FIG. 1E shows the active region for a Brüker short coil probehead in use on the 500 MHz spectrometer at Syracuse University.
FIG. 1F shows the active region for a Nalorac long coil probehead in use on the 500 MHz spectrometer at Syracuse University.
Figure 1G:
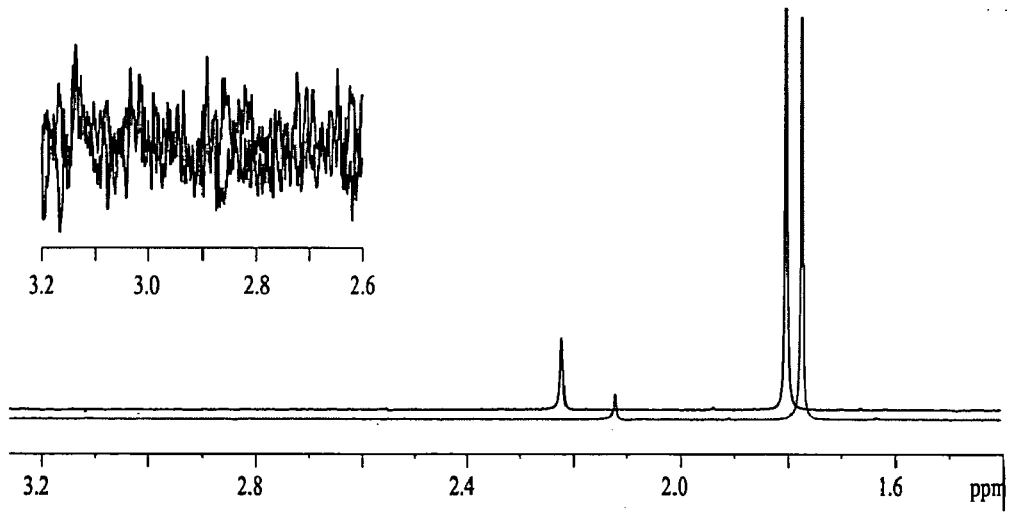
FIG. 1G shows the 500 MHz spectrometer $^1$H Cacodylate 1D signal to noise comparison between PEEK endcap (upper) and glass (lower) tubes, with the sample dissolved in 99.996% $D_2O$. The insert shows the 64x expansion of the noise region used in the determination.

Referring to FIGS. 1E–1F, the active region for a Brüker short coil probehead (FIG. 1E) and a Nalorac long coil probehead (FIG. 1F) in use on the 500 MHz spectrometer at Syracuse University is shown. The active region of an NMR sample depends on the probehead geometry. The majority of 5 mm probeheads in common use have similar geometric configurations. The electronic response of the transmit/receive coil is dominated by the ~12–18 mm zone in the center of the active region labeled as region X. If the sample does not fully occupy this area, it is usually impossible to produce sufficiently homogeneous fields within the coil to ensure high-resolution results. When the sample fills Y, adequate homogeneity in the static ($B_0$) and RF ($B_1$) fields can be obtained, although considerable shim current changes may be required from sample to sample. When the sample fully occupies region Z (roughly three times the height of the transmit/receive coil) shimming becomes much less time consuming, and shim currents will be nearly the same for similar samples.

The instrumental spectral quality (signal/noise ratio) increases linearly with the number of proton spins in the sample active volume and increases only as the square root of the number of scans. Since the height of the sample active volume in a cylindrical sample tube is limited by the probehead geometry, a practical way to increase sample active volume is to increase the radial volume by reducing wall thickness of the sample tube. There is a limit to how much wall thickness can be reduced in conventional glass sample tubes. The thinness of conventional glass sample tube walls, and thereby the maximum practical sample active volume, is constrained by the practical problem of breakage, jeopardizing the safety of the researcher and incurring expensive losses of the samples and tubes.

Figure 2A:
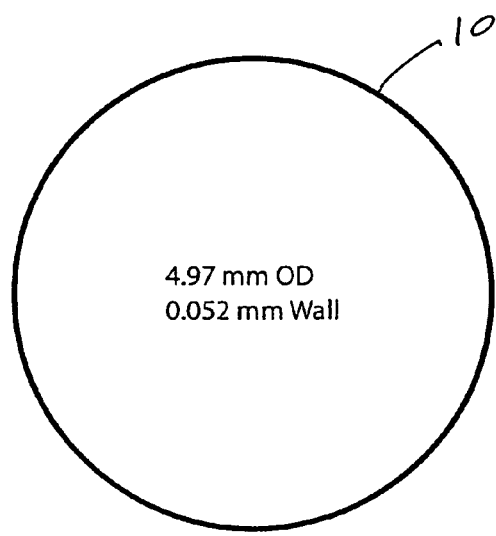
FIGS. 2A–2B show thicknesses of the walls of sample tubes achieved with the present invention.
Figure 2B:
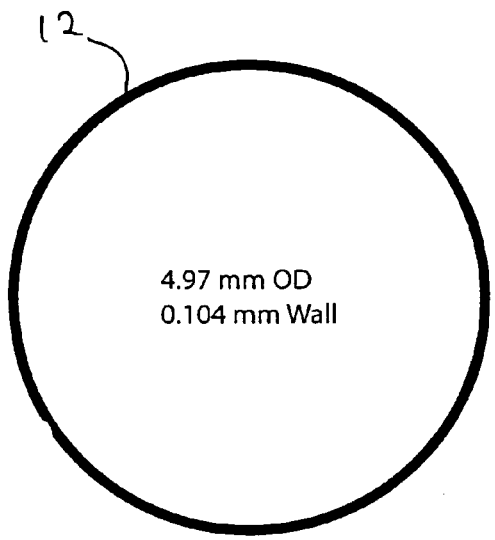
Figure 2C:
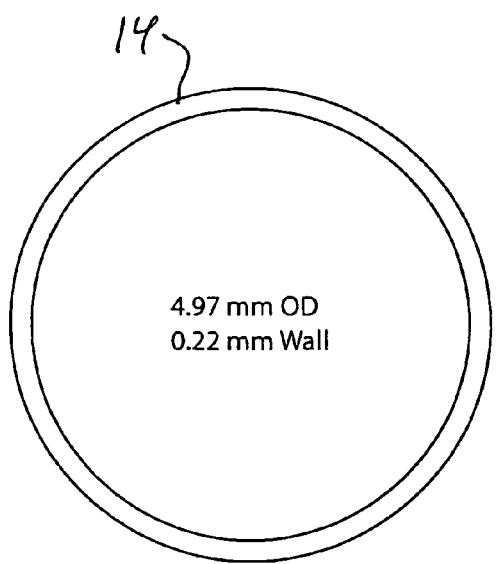
FIGS. 2C–2D show thicknesses of the walls of sample tubes achieved using glass.
Figure 2D:
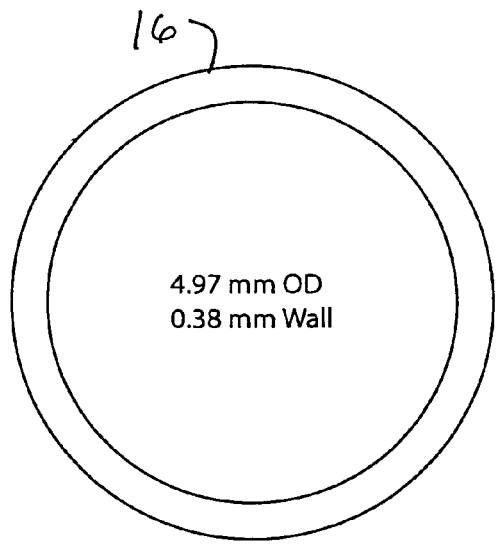

Referring to FIGS. 2A–2B, cross-sections of an embodiment of the present invention are shown. The present invention, in its simplest form, is to form NMR sample tubes from a group of polymeric materials that avoid most of the disadvantages of glass sample tubes. A polymeric sample tube 10 has a wall thickness of 0.052 mm, while a polymeric sample tube 12 has a wall thickness of 0.104 mm. For comparison, the cross-sections of conventional glass sample tubes are shown in FIGS. 2C–2D, with a glass sample tube 14 having a wall thickness of 0.22 mm and a glass sample tube 16 having a wall thickness of 0.38 mm. The outer diameter of 4.97 mm for all the sample tubes is the standard sample tube size used in the industry. Note that the decreased wall thickness translates into an increased sample active volume. The improvement in spectral sensitivity from simply increasing sample active volume is substantial: a 20 percent increase in sample active volume can reduce acquisition time from 10 hours to 7 hours, while a 34 percent increase in sample active volume can reduce the acquisition time from 10 hours to 5.2 hours.

A 2.17 mM Cacodylate solution was made in 99.996% $D_2O$, and then used to fill both a glass tube and a PEEK® endcap well above the receiver coil. Both samples were shimmed carefully, and a single scan was acquired with a 90 degree pulse (both samples had 90 degree pulse widths of 10.2 µs), digitized into 32 k complex points, at the same receiver gain, SW=1262 Hz, with the residual HDO set 1 ppm downfield of the left end of the spectral window. The spectrum is shown in FIG. 1D. Using the standard procedure to calculate signal-to-noise 22 the glass sample had S/N=1130 and the PEEK® sample had S/N=1340. Thus, the PEEK® endcap improved S/N by 18% over glass. The glass tube had an ID of 4.20 mm compared to 4.57 mm for PEEK®. Thus, one would expect an 18% increase due to the increase in volume, and even more if there is a substantial improvement in the receiver coil's filling factor. The agreement is excellent at this preliminary stage, and certainly verifies our expectation that using the PEEK® endcaps should give higher sensitivity.

Matched Bulk Magnetic Susceptibility. Differences between the bulk magnetic susceptibilities ($\chi$) of the sample composition and the sample tube can distort the NMR magnetic field lines. The bulk magnetic susceptibilities of conventional glass NMR tubes are not well matched to typical sample solvents. The resulting discontinuities that occur at the interface between glass and air, and glass and sample solvent, particularly at the tube tip where the glass is often thickest, are particularly bothersome for NMR operators and require careful and time-consuming adjustments to shim coils in the NMR machine. Inadequate or unskillful shimming results in broad or misshapen spectral peaks that reduce sensitivity and resolution. The present invention uses materials for the sample tubes with bulk magnetic susceptibilities that closely match commonly used sample solvents, greatly improving spectral quality, reducing shimming labor and improving sample throughput. The lengths of both the endcap and the positioning rod are preferably adjusted so as to maximize the instrumental sensitivity as dictated by probehead dimensional requirements from different manufacturers. This condition is adjusted accordingly if volumes are to be limited by the distal plug, the positioning rod, or both in combination.

Commercially available polymers exhibit bulk magnetic susceptibilities nearly identical to common NMR sample solvents. Table A shows the bulk magnetic susceptibilities, $\chi$, for tubing materials (rows one and two) and sample solvents (columns one and two) in cgs units. The remaining entries show the percent match between the tube and the solvent. Of interest are the percent matches that are within 5%.

TABLE A

| NMR Sample Solvent | Tube | PI | PEI | PPS | PEEK ® | TEFLON ® | PYREX ® |
|---|---|---|---|---|---|---|---|
| | $\chi/\chi$ | 0.71 | 0.71 | 0.73 | 0.74 | 0.83 | 0.86 |
| DMSO | 0.68 | 4% | 4% | 7% | 8% | 18% | 21% |
| $CHCl_3$ | 0.74 | −4% | −4% | −1% | 0% | 11% | 14% |
| $D_2O$ | 0.70 | 1% | 1% | 4% | 5% | 16% | 19% |
| $H_2O$ | 0.72 | −1% | −1% | 1% | 3% | 13% | 16% |

Magnetic susceptibility values within five percent of each other are considered "matched". A general trend is that the larger the χ value, the less sensitive spectral resolution is to mismatches. The polymers shown by tradename are "ULTEM®" (polyetherimide, also known as PEI), RYTON® (polyphenylene sulfide, also known as PPS), PEEK® (polyetheretherketone) and KAPTON® (polyimide, also known as PI). The solvent compatibilities for these polymers is shown in Table B.

TABLE B

| Material | Chemical Resistance |
| --- | --- |
| ULTEM ® | Usually acceptable for strong acids/bases. Sometimes acceptable for chloro-solvents. |
| PPS ® | Usually acceptable for strong acids; otherwise excellent. |
| KAPTON ® | Usually acceptable for strong acids, bases, chloro-solvents; otherwise excellent. |
| PEEK ® | Usually acceptable for strong acids, chloro-solvents; otherwise excellent. |

Sample Recovery. Recovering expensive sample compounds from the sample tube is customary to reduce cost. This is usually accomplished by washing the tubes with an appropriate solvent and reprocessing the diluted sample to remove the dilutive wash solvent. The surface characteristics of conventional glass sample tubes impede this process, especially for aqueous samples, and can require multiple washes or the loss of a significant portion of the sample compound. The polymers identified for the invention conversely have surface characteristics that facilitate sample recoveries that typically exceed 98 percent without multiple washes.

Chemical Shift Referencing. In organic applications, it is common to include tetramethylsilane (TMS) or another inert substance as an internal standard to calibrate the frequency scale because the chemical shift of TMS=0.000 ppm. TMS cannot be used in biochemical work because it is not water-soluble. Instead, organic salts are used such as d4-TSP ((3-trimethylsilyl)propionic-2,2,3,3-d4 acid sodium) salt and DSS ((3-Trimethylsilyl) propane sulfonic acid sodium) salt. These reference materials may not be completely inert with respect to the system under study and often may have to be removed by HPLC, dialysis, or other purification procedures to recover the sample free from the reference compound. It is therefore desirable to have the reference compound in an isolated concentric tube to preserve axial symmetry and reduce artifacts, such as shown in FIGS. 3A–3B.

Figures 3A, 3B:
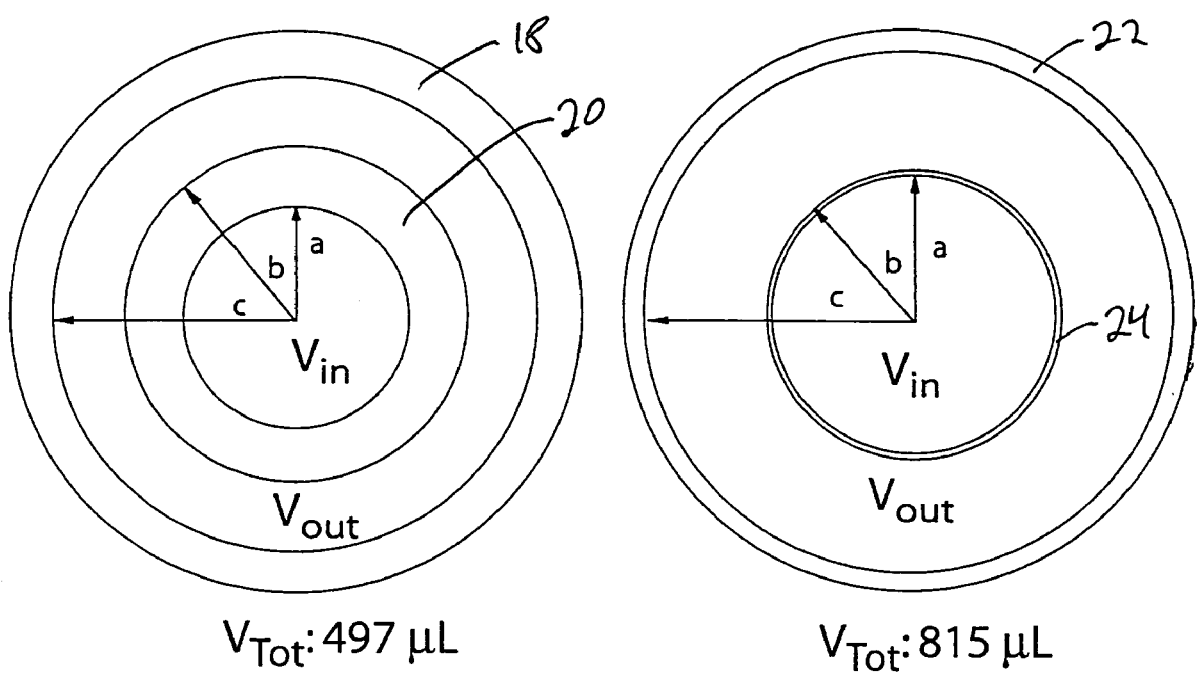
FIG. 3 shows a glass concentric inside a glass tube compared with an Ultem® polymer insert in an Ultem® polymer tube.

In FIG. 3A, an isolated concentric glass tube 20 is inside a glass sample tube 18, while in FIG. 3B, an isolated concentric polymeric tube 24 is inside a polymeric sample tube 22. Both tubes 18 and 22 are 5 mm OD NMR tubes. Using conventional glass in this tube-in-a-tube configuration is problematic because the extra glass present creates additional spectral discontinuities, and even with the thinnest practical wall thickness, leaves little volumetric space for the sample and reference liquids. See Table C for a comparison of the dimensions of the glass and polymer concentric sample tubes shown in FIGS. 3A–3B. The second column in the table refers to the labeled dimensions in FIGS. 3A–3B.

TABLE C

|  | Labeled Dimension | Glass | Polymer |
| --- | --- | --- | --- |
| ID (inner) | 2a | 1.96 | 2.5 |
| OD (inner) | 2b | 2.97 | 2.6 |
| ID (outer) | 2c | 4.2 | 4.61 |
| Inner Wall | b-a | 0.505 | 0.05 |
| Annulus | c-b | 0.62 | 1.10 |
| Total Volume | µL | 497 | 815 |
| V(in)/V(out) |  | 44% | 43% |
| Fill Factor |  | 72% | 98% |

The invention, by employing matched χ materials and much thinner walls (from around 0.05 to around 0.2 mm), substantially reduces discontinuities while enlarging the possible sample active volume and reference active volume.

Referring to FIGS. 4A–4L, an embodiment of the present invention is shown in which an inner reference tube 26 is sealed at the distal end, so that reference tube 26 may easily be axially withdrawn from the proximate end of a sample tube 28 after the calibration scans are done. Tube 26 is concentric within tube 28. This allows the sample to then be scanned at the highest sensitivity since only the sample occupies the active volume of the NMR probe.

FIGS. 4A–4D and 4G–4L show concentric arrangements wherein the seals use a piece of plastic that is machined into an endcap plug to create a seal. The machine endcap plug is machined as to fit snugly and have some space for the application of sealant. This endcap design is based on the premise that tube 26 does not have enough hydrophillic nature to keep the liquid from leaking out. The plug is therefore designed to keep the liquid in. In FIGS. 4E–4F, the endcap has been modified to allow an open-ended tube 26 to fit inside of the machined groove in the endcap. This type of plug is used when the plug has a hydrophillic nature to keep water from leaking out, regardless of the nature of the concentric tube. The flat bottom designs of FIGS. 4A–4D and FIGS. 4G–4H are meant to end-cap an open-ended tube 26. If one has a piece of open-ended tubing, one can take the plug and basically jam it into the bottom of the tube to prevent liquid from coming out. The rounded bottom designs of FIGS. 4I–4L are meant to fit inside of tipped tubes.

Figure 5:
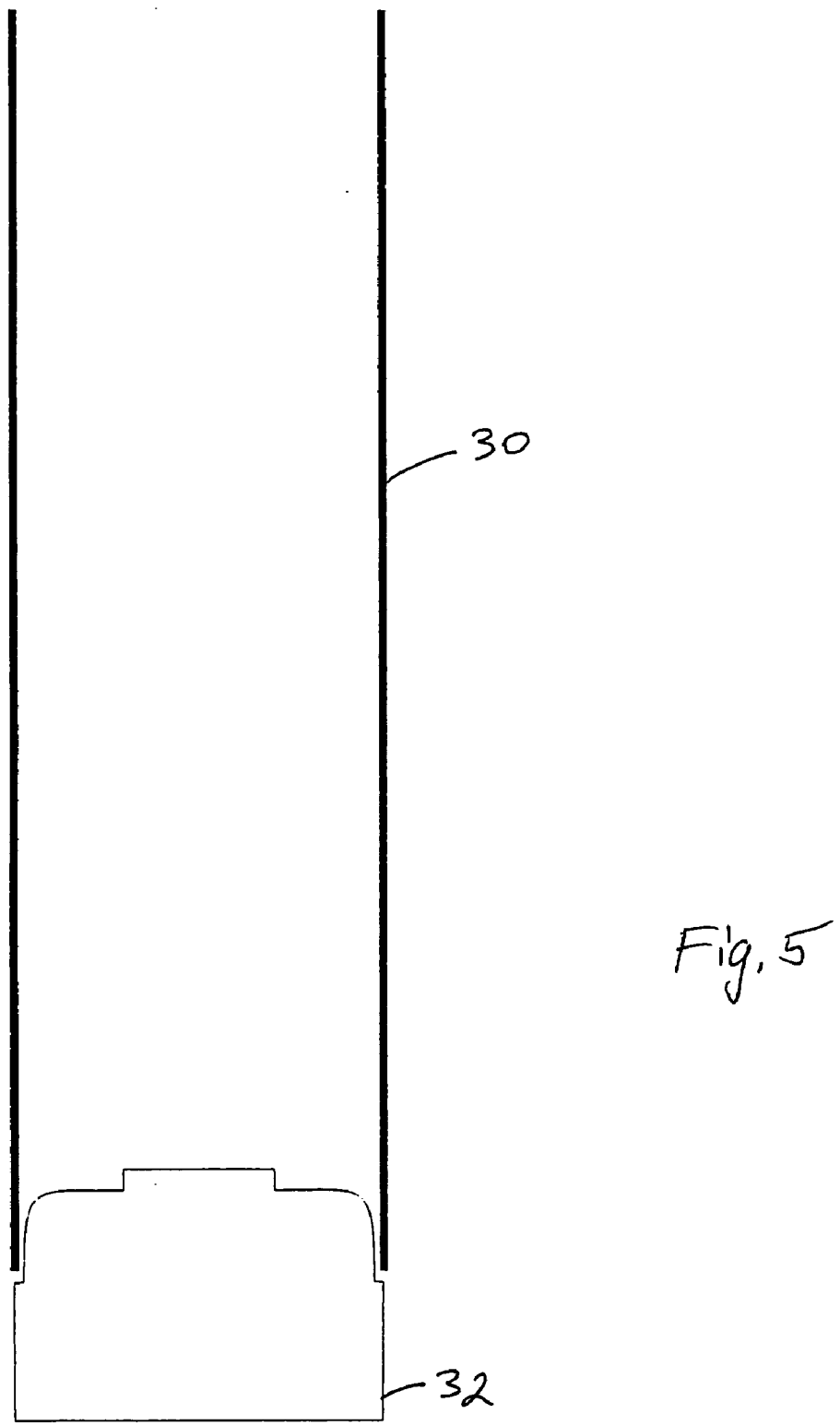
FIG. 5 shows an embodiment of the present invention.

Invention Geometry. Referring to FIG. 5, a sample tube 30 is shown as a mono-tube with a sealing plug 32 according to an embodiment of the invention. The outer diameter of the invention is 4.97 mm in conformity with industry standard sample tubes and NMR cores. The polymer wall thickness may be selected from a range including from 0.05 mm to 0.2 mm, but the selected thickness is preferably precisely uniform for a given tube. The concentricity of sample tube 30 is preferably as close as commercially available polymer forming processes can make it. The distal end is preferably formed closed or is plugged with polymer sealing plug 32 that fits permanently or removably inside the distal end of sample tube 30. Sealing plug 32 is preferably made of suitably matched χ material and is optionally configured in various lengths to occupy more or less of the distal end of sample tube 30 to adjust the elevation of the liquid sample in the NMR probe head.

Figure 6A:
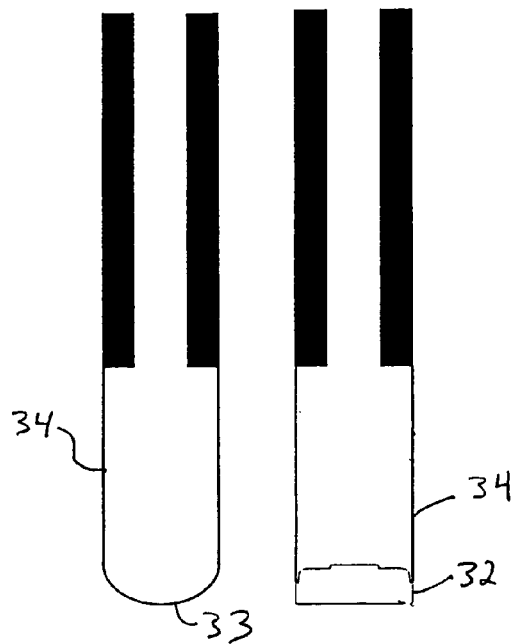
FIG. 6A shows an embodiment of the present invention with one-piece variable wall thickness tubing according to an embodiment of the invention.
Figure 6B:
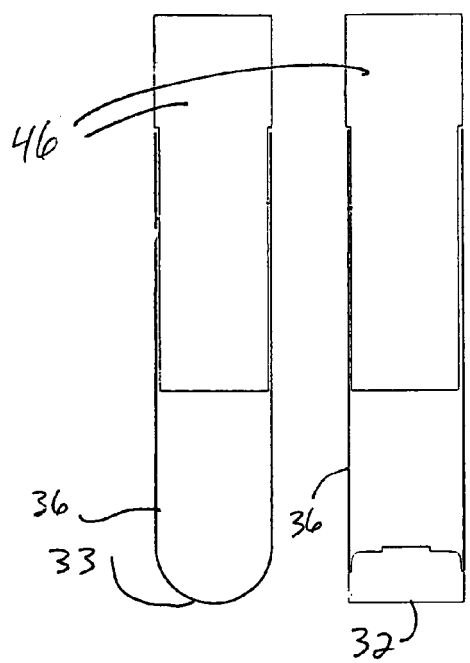
FIG. 6B shows an embodiment of the present invention with a polymer fill tube attached to a positioning rod.
Figure 6C:
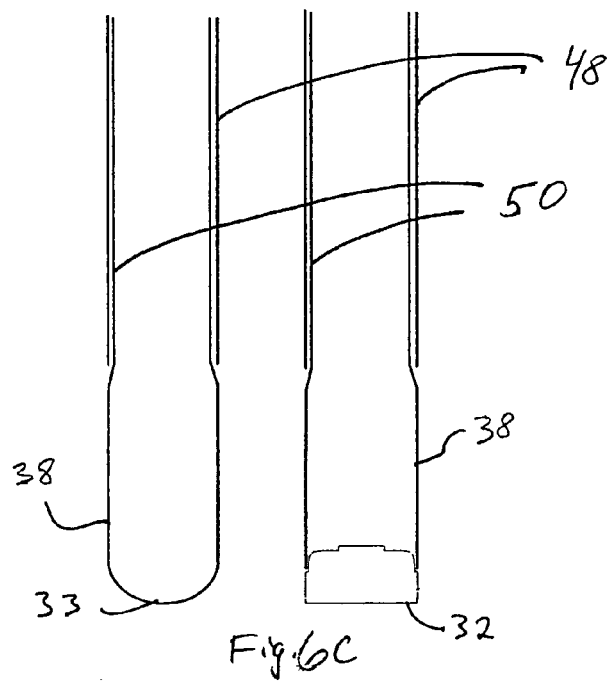
FIG. 6C shows an embodiment of the present invention with a polymer fill tube fitted into an outer sleeve.

FIGS. 6A–6C show three embodiments of mono-tubes according to the present invention. FIG. 6A shows a one-piece tube 34 with variable wall thickness, with one example having a rounded seal 33 and another example having sealing plug 32. FIG. 6B shows a polymer fill tube 36 attached to a positioning rod 46. Again, one example has rounded seal 33 and another example has sealing plug 32. FIG. 6C shows a tube 38 that runs significant longer than the other tubes shown in FIGS. 6A and 6B. The long part 50 of tube 38 fits inside an outer sleeve 48 which would supply most of the required camber and rigidity necessary for proper spinning.

Figure 7:
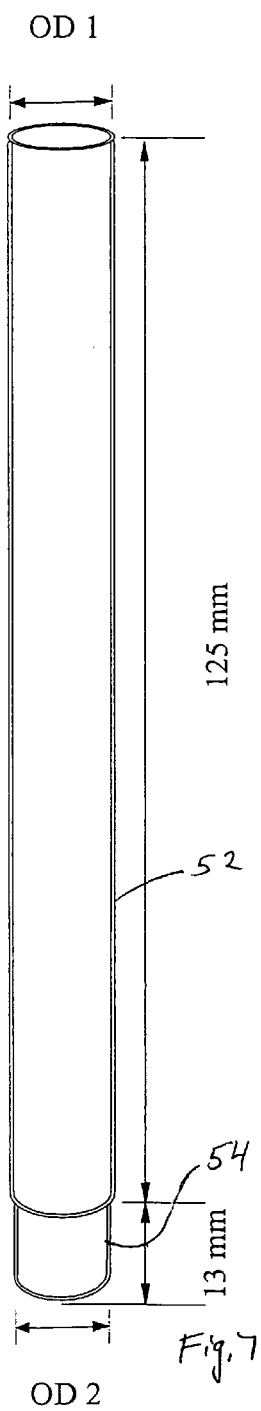
FIG. 7 shows an embodiment of a positioning rod according to an embodiment of the invention.

Referring to FIG. 7, an example of a positioning rod 52 with a fixturing tube 54 is shown. While one embodiment of the invention includes a continuous long sample tube for conventional fixturing in the NMR machine, an embodiment of the invention may be made shorter and press-fit onto a separate fixturing rod or tube such as fixturing tube 54 made from a group of materials including polymers and glasses. The use of positioning rod 52 with fixturing tube 54 in lieu of a continuous long sample tube has several benefits: it permits easier sample recovery from a short, removable sample tube, and the short sample tube presents less surface for sample to clean; it is mechanically more robust while spinning than a full-length thin-wall sample tube; it can be reused; and it is therefore less expensive. The length that the fixturing tube 54 is inserted into the shortened sample tube is selected so that the sample tube is well secured by friction against leaks or release and is properly positioned in the NMR probe head. In the preferred embodiment the inserted length is preferably 1–2 cm. The primary purpose of positioning rod 52 is to provide the necessary camber and concentricity precision required for adequate spinning of the sample. Rod 52 is also needed for sufficient positioning alignment inside of the spinner turbine as well as providing support for any attached endcap tubing piece. If tube 54, shown with an outer diameter of OD2, is positioned at a position such that the rod is not close enough to the RF coil to affect the NMR measurements, material composition is not limited to $\chi$ matched materials as previously described. If the tube 54 is positioned at a distance position such that rod 52 can be considered to affect the NMR measurements, material composition should be composed of the $\chi$ matched materials as previously described.

Figure 8A:
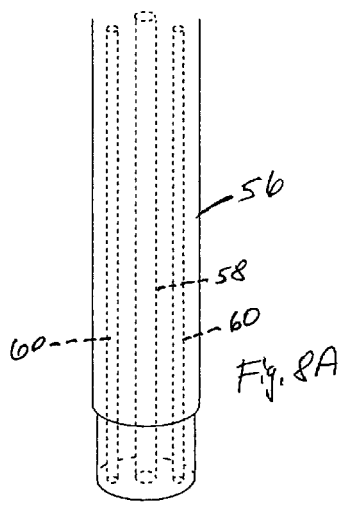
FIG. 8A shows an embodiment of a positioning rod with a concentric tube alignment rod.
Figure 8B:
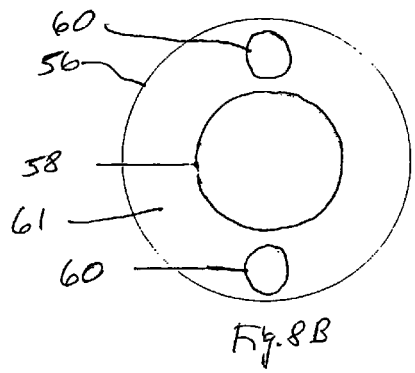
FIG. 8B shows a top view of the rod of FIG. 8A.
Figure 8C:
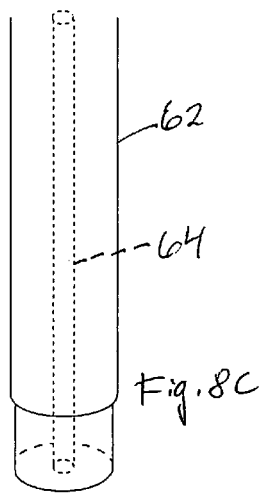
FIG. 8C shows an embodiment of a positioning rod with a concentric tube alignment rod.
Figure 8D:
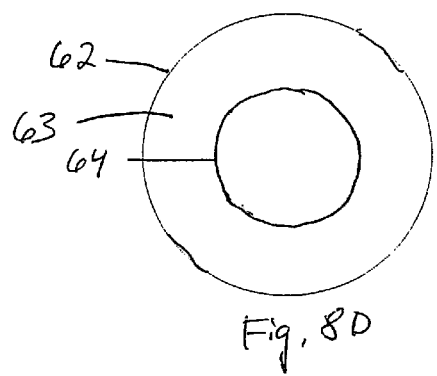
FIG. 8D shows a top view of the rod of FIG. 8C.
Figure 8E:
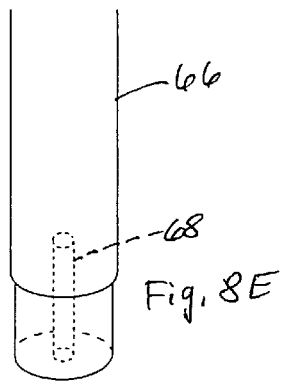
FIG. 8E shows an embodiment of a positioning rod with a concentric tube alignment rod.
Figure 8F:
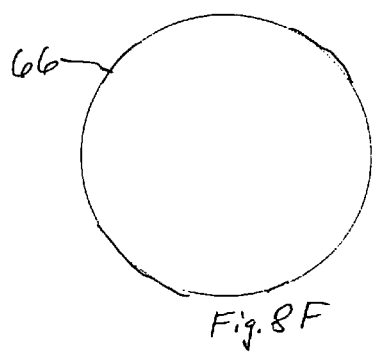
FIG. 8F shows a top view of the rod of FIG. 8E.

Referring to FIGS. 8A–8F, variations of fixturing or positioning rods are shown. FIGS. 8A–8B show a positioning rod 56 with a concentric tube 58 which can be used for filling, mixing, or evacuating the sample. Additional tubes 60 are optionally also used for filling, mixing, or evacuating the sample. The volume 61 within rod 56 that is not part of tube 58 or tubes 60 is solid, i.e., made out of the polymer material. FIGS. 8C–8D show a positioning rod 62 with a concentric tube 64 which can also be used for filling, mixing, or evacuating the sample. The concentric portion 63 is solid polymer. FIGS. 8E–8F show a solid positioning rod 66 which can be modified to include a concentric tube alignment space 68. Regardless of material selection, sufficient camber and concentricity ensure that spectral quality is not compromised.

Referring to FIGS. 9A–9F, the positioning rod's physical composition can be varied as dictated by the nature of the investigation being carried out. If standard liquid-state NMR measurements are being carried out where the rod is not located near the RF coil, solid rod and/or tubing is adequate. If standard liquid-state NMR measurements are being carried out where the rod is located near the RF coil, materials in direct contact with the sample proximal to the detector active region should be $\chi$ matched to create a continuous layer of magnetically equivalent material. If separation and mixing NMR experiments are to be conducted, a multi-lumen rod configuration is necessary for the transfer of materials out of and into the NMR detection area. Plugs of materials should be employed to occupy the sample transfer spaces to create a continuous layer of magnetically equivalent material.

FIG. 9A shows a tube 70 with a sample 72. The horizontal lines at 74 show the probe detection area. A positioning rod 76 and a sealing plug 78 enclose sample 72. Because positioning rod 76 and sealing plug 78 are far enough away from probe detection area 74, they do not need to be $\chi$ matched. In FIG. 9B, a positioning rod 80 is not $\chi$ matched, while a sealing plug 82 is $\chi$ matched because of its proximity to probe detection area 74. In FIG. 9C, both a positioning rod 84 and a sealing plug 86 are $\chi$ matched. In FIG. 9D, a positioning rod 88 is not $\chi$ matched, nor is a lower part of a sealing plug 90, while a portion 90a of the sealing plug is $\chi$ matched. In FIG. 9E, a positioning rod 92 includes a $\chi$ matched portion 92a, and a sealing plug 94 includes a $\chi$ matched portion 94a. In FIG. 9F, a positioning rod 96 is $\chi$ matched, while a sealing plug 98 includes a $\chi$ matched portion 98a.

Separation/Mixing High Throughput Screening NMR Using a Polymer Concentric Tube System. NMR has been used to screen ligands for affinity to a macromolecular target as disclosed in Skalicky, J. J., Sukumaran, D. K., Mills, J. L. and Szyperski, T., *Toward Structural Biology in Supercooled Water*, J. Am. Chem. Soc. 122, 3230–3231 (2000); Peng, J. W. Lepre, C. A. Fejzo, J., Abdul-Manan, N., Moore, J. M. Meth. Enzymol., 338, 202–230 (2001); Moore, J. M., Curr. Opin. Biotechnol, 10, 54–58 (1999); Hajduk, P. J., Meadows, R. P., Fesik, S. W., Q. Rev. Biophys, Vol. 32, pp. 211–240 (1999); Zartler, E. R., Yan J, Mo H, Kline A. D., Shapiro M. J. Curr Top Med Chem., 3(1):25–37 (2003), Fielding, L., Curr Top Med Chem, 3(1):39–53 (2003), each of which is incorporated herein by reference. Many applications have adapted techniques originally developed in the Fesik laboratory, described as "Structure Activity Relationships (SAR) by NMR" in Shuker, S. B. Hajduk, P. J., Meadows, R. P., and Fesik, S. W., Science, 274, 1531–1534 (Washington, D.C. 1996); and Medek, A., Hajduk, P. J., Mack J., Fesik, S. W., J. Ann Chem. Soc. 122, 1241–1242 (2000), each of which is incorporated herein by reference. This method focuses primarily upon the changes in 15 N, 1 H, and 13 C chemical shifts that occur in labeled proteins as determined in 2D and 3D spectra. The rather large deviations occur near the vicinity of the target protein-binding site, so that comparisons can be made visually and/or aided by pattern recognition algorithms without the need to generate difference spectra. The commercial application of this method would be to screen combinatorial compound libraries in the development of lead candidate drugs. However, the long acquisition times required for multi-dimensional NMR limit throughput rates when compared to other screening methods that presently exist, e.g., fluorescence binding assays.

Additional NMR methods have been developed that exploit differences between bound and free ligands as disclosed in Hajduk, P. J. Olejniczak, E. T. Fesik, S. W., J. Am. Chem. Soc., 119, 12257–12261 (1997); Lin, M., Shapiro, M. J., Wareing, J. R., Am. Chem. Soc., 119, 5249–5250 (1997); Mayer, M., Meyer, B., Angew, Chem., Int. Ed., 38, 1784–1788 (1999); Bleicher, K., Lin, M., Shapiro, M. J., Wareing, J. R., J. Org. Chem, 63, 8486–8490 (1998); Chen, A., Shapiro, M. J., J. Am. Chem. Soc., 122, 414–415 (2000), each of which is incorporated herein by reference, by monitoring ligand properties via diffusion editing and other techniques. This method focuses on the different diffusion rates that occur between bound and freely rotating molecules. Drug candidates, small unbound molecules, rotate freely and tend to diffuse rapidly in solution. Their corresponding NMR signals are characterized by sharp spectral lines. In comparison, if a drug successfully binds to a target protein, its diffusion rate becomes much slower, so that the resultant NMR signal is characterized by a broader peak. An advantage of this NMR technique is that it does not require isotopic labeling and is ideally suited for larger protein systems. When applied to 1D applications, NMR screening becomes much more rapid and nearly competitive with other screening methods.

The commercial method most similar to the proposed application uses NMR flow cell technology as disclosed in Stockman, B. J., Curr. Opin. Drug Discovery Dev., 3, 269–274 (2000); Stockman, B. J. Farley, K. A., Angwin, D. T., Meth. Enzymol, 338, 230–246 (2001), each of which is incorporated herein by reference, of which initial setups generally cost between $130K–$175K (YR 2003 dollars). In addition, a spectrometer dedicated only to flow applications usually is required due to the specialized probes that are very difficult to maneuver. With the employment of metered fluid delivery devices under an inert atmosphere using precision tubing, samples are transferred into and out of the NMR probe sample space where spectra are acquired. Because sample tubes cannot spin in the probe sample space, magnetic field homogeneity is considerably less optimal compared to spinning samples scanned in high-resolution probeheads.

Because structural changes usually cause changes in chemical shifts and binding of small molecules to polymers that broaden NMR signals, a rapid screening system can be achieved utilizing a concentric tube system and the quantitative internal NMR reference standards. A Separation/Mixing NMR (S/M NMR) methodology and sampling system allows for improved measurements. S/M NMR experiments allow rapid screening for a mixture of compounds to aid distinguishing preferential binding of drugs to target molecules. When combined with the internal quantitative NMR reference reagent system, this procedure allows quantification of binding affinities for compounds that bind to the target molecule. These are important considerations towards the design and characterization of pharmaceutical compounds designated in the treatment of human, animal and plant diseases. The ability to obtain spectra of isolated species, as well as combined species in the same sample tube, helps to minimize spectral artifacts and allows true differences in molecular nature to be distinguished. The device and methodology increases the throughput of the screening process so that the collection of NMR signals for each separated/mixed system is accomplished in about a minute. With appropriate automation, it should be possible to collect >1000 NMR data sets per day using a single NMR instrument. Many steps have the potential to be streamlined that allow for the possibility of automation, thereby cutting down on potential user-derived errors and leading to increased reliability.

Methods for Separation/Mixing High Throughput Screening NMR Using a Polymer Concentric Tube System. For many spectroscopic techniques, an accepted protocol for studying interacting systems is to (a) measure spectra of isolated species, (b) mix the species by stepwise titration or single transfer, (c) repeat spectral measurements with the mixed species sample, and finally (d) relate interactions by quantifying the differences between initial (a) and final (c) spectra. If the resultant difference spectrum is featureless, one can conclude that there are no significant interactions between the two species. This is based upon the premise that interactions cause physical changes that result in spectral changes. Differences exhibited in the spectra are usually visually obvious. However if this systematic methodology is applied to spectroscopy characterized by very sharp peaks, a characteristic of NMR measurements, subtraction artifacts often significantly influence the difference spectrum.

The reference spectrum, (Sep), is composed of target protein in the outer annulus, with candidate drug(s) with an internal NMR quantitative reference reagent (R), such as DSS or TSP, contained in the inner tube. Both species are present at equivalent height and fixed volume so that concentrations can be verified internally via the internal NMR reference reagent. When the separated components are mixed (Mix) so that initial height and volume conditions are reproduced, an equivalent number of nuclei should be present in the receiver coil found in the first (Sep) spectrum. The difference spectrum is highly informative and subtraction artifacts are minimal.

Figure 10A:
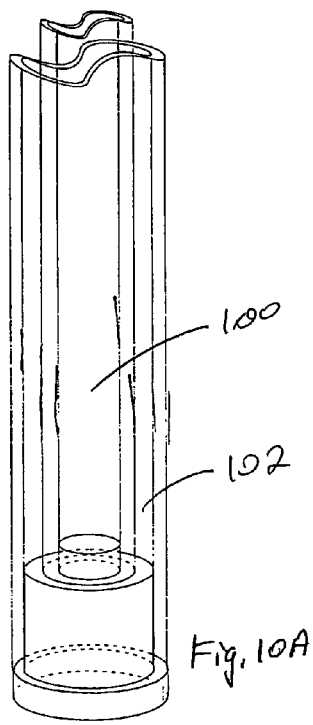
FIGS. 10A–10F show embodiments of tubes with concentric, tube-in-tube arrangements.
Figure 10B:
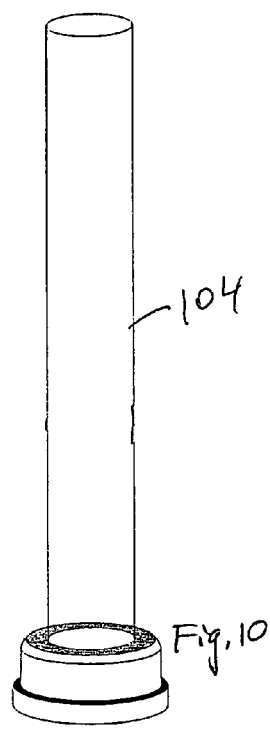
Figure 10D:
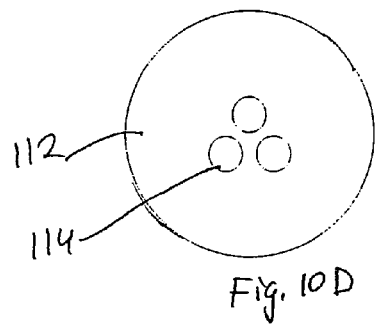
Figure 10C:
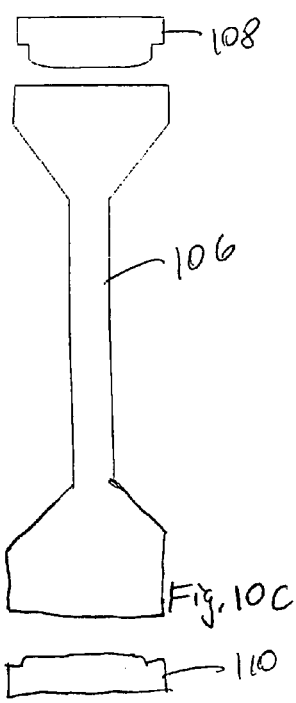
Figure 10E:
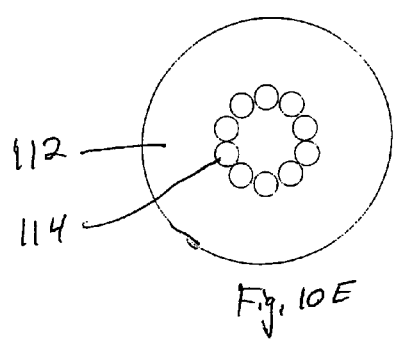
Figure 10F:
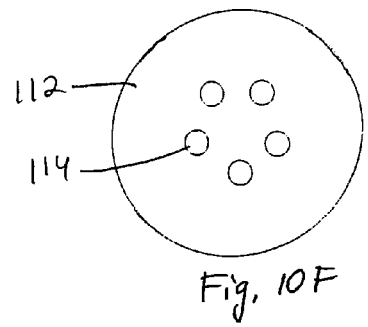

FIGS. 10A–10F show example geometries of concentric, tube-in-tube embodiments of the invention. FIG. 10A shows a centrosymmetric arrangement using an inner tube 100 and an outer tube 102, while FIG. 10B shows a centrosymmetric arrangement using single piece construction, i.e., a single tube 104, and FIG. 10C shows a tube 106 with sealing plugs 108 and 110 in a centrosymmetric arrangement using single piece construction with an hourglass configuration. FIGS. 10D–10E show possible multiple tube positioning arrangements with a plurality of tubes 114 within a positioning rod 112.

These embodiments provide significant advantages when a reference material is to be analytically compared with the sample material. Although the current accepted protocol is to employ a single, centro-symmetrically-positioned concentric glass tube arrangement, multiple tube arrangements of polymeric materials should provide experimental advantages that lead to spectral improvements. With the aid of spinning, different arrangements result in the multiple chambers to be seen experimentally as uniformly distributed throughout the sample.

If the sample tube is formed with a closed end, the inner tube(s) may be concentrically positioned by at least one insert having means of precisely positioning the inner tube(s) axially. If the sample tube is formed with an open end sealed with a distal sealing plug, such distal sealing plug may incorporate means of positioning the inner tube(s) axially. The inner tube(s) may be permanently sealed to hold a reference compound and such inner tube(s) may be insertable or removable from the sample tube. Uses for such reference tubes include concentration determinations as are known to those skilled in the art. (See "Accurate Nucleic Acid Concentration by Nuclear Magnetic Resonance", M. J. Cavaluzzi, D. J. Kerwood, P. N. Borer, Analytical BioChemistry 308 (2002) 378–380, incorporated herein by reference.) Alternatively, the inner tube(s) may contain a compound to be mixed with the sample compound in the outer sample tube, as for example when an interaction is being studied such as drug-receptor binding. The inner tube(s) for such applications is only temporarily sealed by means incorporated in the distal sealing plug. To mix the two compounds, the researcher pulls the inner tube(s) from the sealing means incorporated in the distal sealing plug and allows the inner tube(s) compound to be mixed with the sample compound.

Figure 11A:
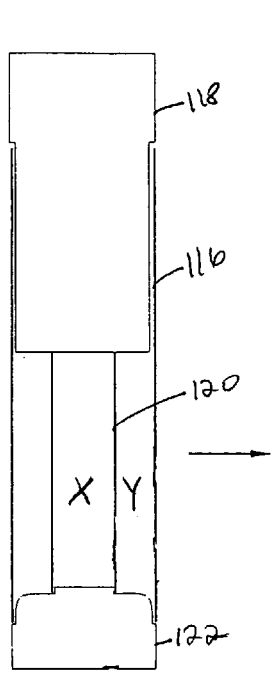
FIGS. 11A–11D show embodiments of the present invention with inner and outer tubes to allow for reference testing and/or sample mixing.
Figure 11B:
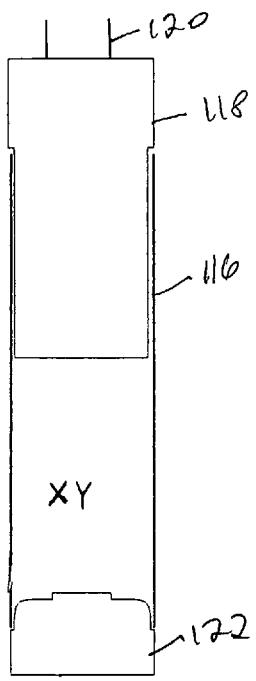

FIGS. 11A–11B are designed for an endcap-plugged concentric tube that can be removed to mix Sample A and Sample B. FIG. 11A shows a sampling tube 116, a sealing plug 122, and a positioning rod 118 contain a sample x within an inner tube 120 and a sample Y within tube 116. Inner tube 120 is pulled up through positioning rod 118

(FIGS. 8A, 8C) to mix samples X and Y as shown in FIG. 11B. In addition, samples X and Y could be drawn up through inner tube 120 or the same passage in positioning rod 118 to accomplish mixing and then reinjection back into the sample space.

Figure 11D:
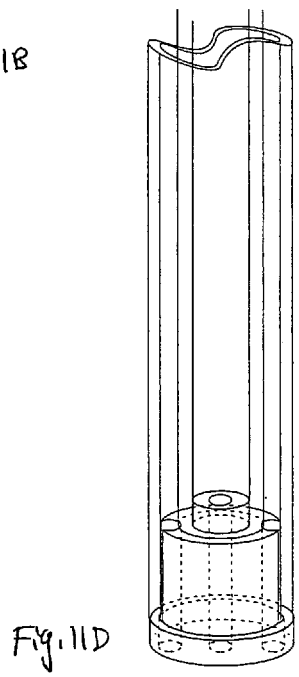
Figure 11C:
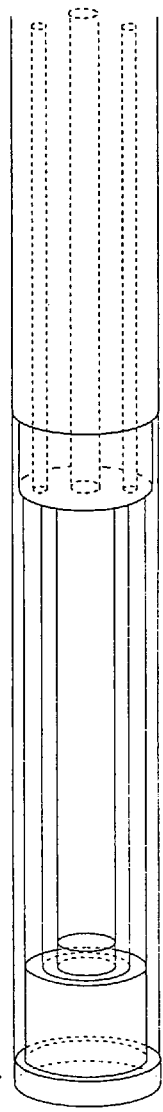

FIG. 11C shows a top sample loading arrangement using the positioning rod shown in FIG. 8A. This system is designed for the case when the concentric tube is not removed. Sample X and sample Y are initially sequestered in separate compartments, the scan is taken, the samples are transferred up the positioning rod (FIG. 8A), and mixed. After mixing, the samples are reinjected back into the sample tube for post-mixing NMR scans.

FIG. 11D shows a bottom sample loading arrangement similar to that shown in FIG. 11C except that there is a fluid delivery system (not shown) that transfers liquids into and out of the sample tube from the bottom holes. The concentric tube is not removed. Sample X and sample Y are initially sequestered in separate compartments, the scan is taken, the samples are transferred out of the sample tube through the fluid delivery system through the endcap on the bottom, and then mixed. After mixing the samples are reinjected back into the sample tube for post-mixing NMR scans.

In another embodiment, the insertion or removal of the inner tube(s) can be done without removing the sample tube from the NMR machine (and requiring re-shimming) via the annulus in the fixturing tube.

The following well-known arguments should serve as a review to practitioners of biochemistry and NMR spectroscopy; however, application in a specially designed NMR sequestration device has not yet been explored in the prior art.

The arguments outlined in below assume a stoichiometric relationship, u=v=1, for $P_u \cdot D_v$ complexes. They also assume that the input concentrations $[P]_i \approx [D]_i \approx 1$ mM. Other well described stoichiometric relationships have effects on $K_d$ form and limiting ranges of concentrations; however, these are not fully enumerated herein since they are known in the art.

On an NMR time scale, slow exchange rates are usually fast enough to establish equilibrium over the minutes or hours prior to the acquisition of the $FID_{Mix}$. In terms of pharmaceutical significance, this situation is probably the case for small organic compounds that may bind to a protein or other target macromolecule. Information concerning binding equilibria that occur in the intermediate/fast exchange on the NMR time scale can be determined; however, interpretations of these results are not enumerated here.

Figure 12A:
FIGS. 12A–12D show examples of free induction delay (FID) signals used to describe a method according to an embodiment of the present invention.
Figure 12B:

The protein target $P_i$ is kept separate from the candidate drug molecule(s) $D_i$ that may form a P·D complex. Initial solutions containing $P_i$ and $D_i$ are isolated in concentric chambers of a specially constructed NMR sequestration sampling system. The initial free induction decay (FID) signal containing NMR information is then acquired for the separated components, $FID_{Sep}$. FIG. 12A shows the $FID_{Sep} = D_i + P_i$ for the drug separated from the protein. In the mixing step, $P_i$ and $D_i$ solutions are combined and a second NMR signal is collected, $FID_{Mix}$. FIG. 12B shows $FID_{Mix} = D_i * P_i$ for the drug combined with the protein.

Figure 13A:
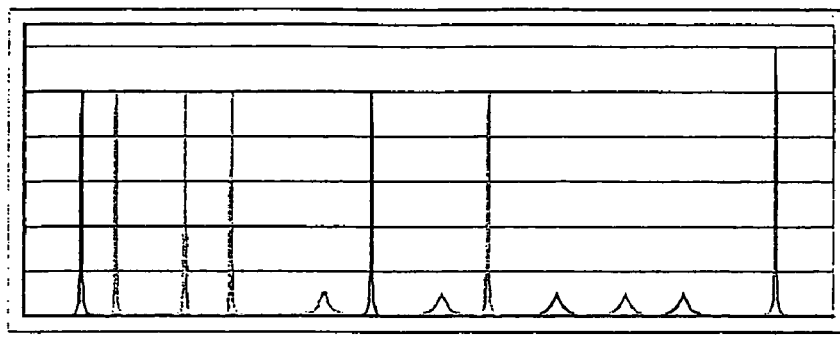
FIGS. 13A–13C show examples of frequency domain signals based on FID signals used to describe a method according to an embodiment of the present invention.
Figure 13B:
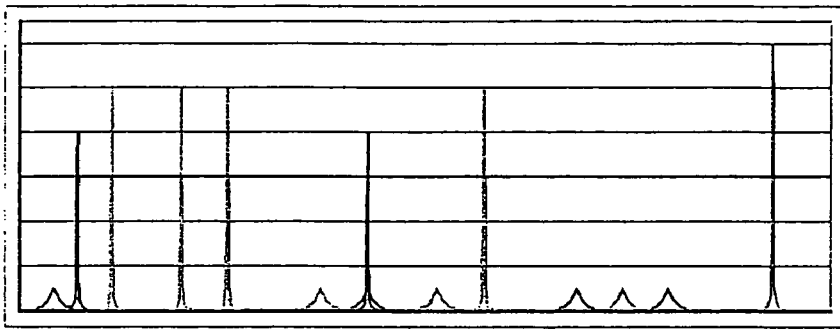

Time domain data is processed via discrete Fourier transformation to the frequency domain. This process converts the FID data to the frequency domain signals, $Sig_{Sep}$ and $Sig_{Mix}$. The frequency domain signals corresponding to transformed FID data are represented in FIG. 13A ($Sig_{Sep}$) and FIG. 13B ($Sig_{Mix}$).

Figure 12C:
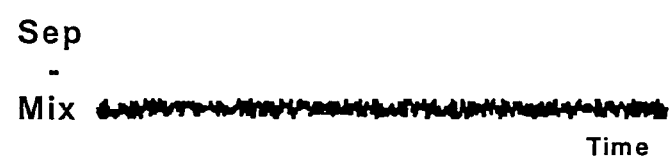
Figure 12D:
Figure 13C:
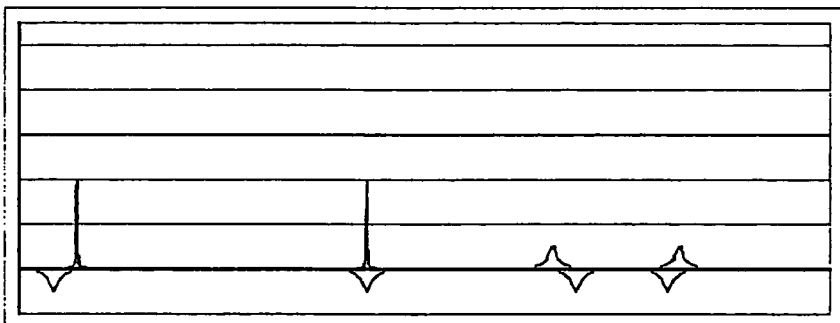

When the two frequency domain signal spectra are subtracted from one another, a difference spectrum results: $Sig_{Dif} = Sig_{Sep} - Sig_{Mix}$ (FIG. 13C). Alternatively, the two FIDs (from FIGS. 12a and 12B) can be subtracted and the difference FID (FIGS. 12C and 12D) can be Fourier-transformed. Signal intensities seen in $Sig_{Dif}$ that exhibit positive differences are indicative of the formation of substantial amounts of a new P·D complex.

Possible results that may be seen in the $Sig_{Dif}$ are detailed in the following two scenario descriptions.

(1) In the case where $K_d = [P_i][D_i]/[P \cdot D] \geq 10^{-2}$; the P·D complex either does not form or very weak interactions occur. In this situation, corresponding drug NMR signals remain unchanged in the $Sig_{Mix}$ and therefore should subtract to zero in $Sig_{Dif}$. However, the problem of experimental inconsistencies probably produce spectral artifacts that appear in the $Sig_{Dif}$ spectrum. These artifacts are the residual by-products that result from the subtraction of sharp absorption mode NMR signals. Close examination of $FID_{Dif} = FID_{Sep} - FID_{Mix}$ should suffice to reach a conclusion that no significant interactions occur between the target protein and the candidate molecule(s). $FID_{Dif}$ that are dominated by experimental noise are indicative of candidate molecules that do not strongly bind as shown in FIG. 12C.

In the case where $K_d = [P_i][D_i]/[P \cdot D] = 10^{-4}$ substantial amounts of a new P·D complex has formed. As a result, examination of $FID_{Dif} = FID_{Sep} - FID_{Mix}$ exhibits significant deviations and does not subtract out to zero as shown in FIG. 12D. The transformed $Sig_{Dif}$ exhibits positive intensities at frequencies corresponding to $[D_i]$ as shown in FIG. 13C.

The resultant $Sig_{Dif}$ [P·D] integrals can be quantitatively related to $K_d$ by integral comparison to $P_i$ and $D_i$ peak intensities.

Several candidate molecules may be included in a mixing experiment. Dominant features exhibited in the $Sig_{Dif}$ are indicative of candidates that experience the strongest binding. Use of an internal quantitative NMR reference reagent, R, may be included in mixing experiments to aid in binding equilibrium analysis.

In the presence of a known concentration, [R], it is possible to quantify $[P_i]$, $[D_i]$, and [P·D] by quantitative peak integral comparison. This methodology can be applied in the determination of binding constants that range from $0.01 > K^{d,i} > 10^{-6}$ if $[D_i] \cong 1.0$ mM and $[P_i]_0 \cong 0.1$–1.0 mM. If experiments are conducted using a 500+ MHz NMR spectrometer, these conditions can be met routinely.

(2) By comparison of the peak integrals, candidate molecules that display $K_d > 0.01$ can be classified as weak binders and $K_d < 10^{-6}$ as strong binders. With use of appropriate NMR processing techniques, it is possible to overlay the $R_{Sep}$ to $R_{Mix}$ frequencies exactly to aid in the reduction of subtraction artifacts.

Advantages. The outlined methodology has important advantages. Current methods must acquire three separate spectra: $P_{sep}$, $D_{sep}$, and [P·D]Mix, and possibly use three separate NMR tubes to do so. Serious spectral artifacts result from the incorrect subtraction of Lorentzian NMR lines as disclosed by Hajduk, P. J. Olejniczak, E. T., Fesik, S. W., J. Am. Chem. Soc., 119(50), 12257–12261 (1997); Fesik, S. W. Zuiderweg, E. R., Olejniczak, E. T., Gampe, R. T., Biochem Parmacol., 1;40(1), 161–7 (1990), each of which is incorporated herein by reference. These inconsistencies ultimately can mask subtle effects caused by real physical interactions.

With the sample-mixing sequestration device, sample-tube variation is minimized because all data acquisitions are conducted within the same outer NMR sample tube. In terms of simple time requirements, another advantage is realized because this methodology reduces the total number of scans from three to two. The need to eject the sample when acquiring separate $P_i$ and $D_i$ scans is effectively eliminated. This reduction in positioning variability cuts down on subtraction artifacts. Keeping a constant number of spins in the sample space also eliminates the need for normalizing factors in subtracting the spectra.

In an attempt to minimize NMR subtraction artifacts, it is vital that the sample and magnet field environment be as indistinguishable as possible between all data acquisitions. Because the sample tube remains in the same position in the NMR instrument, an optimal magnetic field environment achieved by singular shim settings can be maintained throughout the course of the entire investigation. This advantage is paramount towards eliminating small frequency instabilities that can consequentially introduce large subtraction artifact errors, in addition to speeding up the entire process.

Small deviations between sample-tube construction and spinning character contribute towards inter-spectrum abnormalities. Because tube usage does not change between inter-acquisition scans, tube thickness and density differences are avoided. This helps in the ability to quantify interactions that appear in the difference spectrum. Quantitative referencing helps to elucidate the differences between new peaks and spectral artifacts.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A nuclear magnetic resonance (NMR) sample apparatus, comprising:
    a sample tube;
    wherein said sample tube is made from a polymeric material; and
    wherein said polymeric material is selected from the group of polymeric materials which have a bulk magnetic susceptibility (chi factor) that is within five percent of both a chi factor of an unadulterated solvent and a chi factor of a combination of said solvent and a sample.

2. An NMR sample apparatus according to claim 1, wherein said solvent is selected from the group consisting of water, heavy water, heavy dimethylsulfoxide, and heavy chloroform, wherein said sample is solvated by said solvent, and wherein said polymeric material is selected from the group consisting of polyetherimide, polyphenylene sulfide, polyetheretherketone, and polyimide.

3. An NMR sample apparatus according to claim 1, wherein said sample tube has a uniform wall thickness of between 0.02 mm and 0.20 mm in a region of said sample tube detectable by a probehead of an NMR unit.

4. An NMR sample apparatus according to claim 2, wherein said sample tube has a uniform wall thickness of between 0.02 mm and 0.20 mm in a region of said sample tube detectable by a probehead of an NMR unit.

5. An NMR sample apparatus according to claim 1, further comprising an inner tube inside said sample tube.

6. An NMR sample apparatus according to claim 5, wherein said inner tube is removably attachable to said sample apparatus.

7. An NMR sample apparatus according to claim 6, wherein said inner tube is sealed at its distal end.

8. An NMR sample apparatus according to claim 1, further comprising a positioning rod fitting into a proximate end of said sample tube.

9. An NMR sample apparatus according to claim 8, wherein said positioning rod includes a concentric tube therein.

10. An NMR sample apparatus according to claim 8, wherein said positioning rod includes a plurality of tubes therein.

11. An NMR sample apparatus according to claim 8, wherein said positioning rod has a chi factor that is within five percent of both said chi factor of an unadulterated solvent and said chi factor of a combination of said solvent and a sample.

12. An NMR sample apparatus according to claim 11, wherein further comprising an endcap on a distal end of said sample tube, wherein said endcap has a chi factor that is within five percent of both said chi factor of an unadulterated solvent and said chi factor of a combination of said solvent and a sample.

13. An NMR sample apparatus according to claim 1, further comprising an endcap for a distal end of said sample tube.

14. An NMR sample apparatus according to claim 13, wherein said endcap has a chi factor that is within five percent of both said chi factor of an unadulterated solvent and said chi factor of a combination of said solvent and a sample.

15. An NMR sample apparatus according to claim 13, wherein said endcap is one-piece with said sample tube.

16. An NMR sample apparatus according to claim 15, wherein said endcap has a flat bottom.

17. An NMR sample apparatus according to claim 15, wherein said endcap has a rounded bottom.

18. An NMR sample apparatus according to claim 13, wherein said endcap is a sealing plug.

19. An NMR sample apparatus according to claim 18, wherein said sealing plug has a flat bottom.

20. An NMR sample apparatus according to claim 18, wherein said sealing plug has a rounded bottom.

21. An NMR sample apparatus according to claim 1, wherein said sample tube has variable wall thickness.

22. A nuclear magnetic resonance (NMR) sample apparatus, comprising:
    a sample tube; wherein said sample tube is made from a material selected from the group of polymeric materials which have a bulk magnetic susceptibility (chi factor) that is within five percent of both a chi factor of an unadulterated solvent and a chi factor of a combination of said solvent and a sample;
    a positioning rod in a proximate end of said sample tube; and
    an endcap in a distal end of said sample tube,
    wherein, when said sample is contained in said sample tube, bounded on one side by said positioning rod and bounded on another side by said endcap, and said sample is placed within a NMR detection area,
    when said positioning rod is proximate said NMR detection area, said positioning rod has a chi factor that is within five percent of both said chi factor of said unadulterated solvent and said chi factor of said combination of said solvent and said sample, and
    when said endcap is proximate said NMR detection area, said endcap has a chi factor that is within five percent of both said chi factor of said unadulterated solvent and said chi factor of said combination of said solvent and said sample.

23. A method of matching a bulk magnetic susceptibility (chi factor) of an NMR sample apparatus and a sample within a NMR process, comprising the steps of:
- solvating said sample with a solvent;
- providing a sample tube; wherein said sample tube is made from a material selected from the group of polymeric materials which have a bulk magnetic susceptibility (chi factor) that is within five percent of both a chi factor of said unadulterated solvent and a chi factor of said solvated sample;
- inserting an endcap in a distal end of said sample tube,
- inserting said solvated sample in said sample tube;
- inserting a positioning rod in a proximate end of said sample tube;
- placing said solvated sample within said sample tube within a NMR detection area; and
- maximizing instrumental sensitivity of said NMR process by ensuring that when said positioning rod is proximate said NMR detection area, said positioning rod has a chi factor that is within five percent of both said chi factor of said unadulterated solvent and said chi factor of said solvated sample, and by
- ensuring that when said endcap is proximate said NMR detection area, said endcap has a chi factor that is within five percent of both said chi factor of said unadulterated solvent and said chi factor of said solvated sample.

24. A method according to claim 23, wherein said solvent is selected from the group consisting of water, heavy water, heavy dimethylsulfoxide, and heavy chloroform.

25. A method of testing a sample using nuclear magnetic resonance (NMR), comprising the steps of:
- providing a sample apparatus which includes an inner sample tube and an outer sample tube; wherein said inner and outer sample tubes are made from a material selected from the group of polymeric materials which have a bulk magnetic susceptibility (chi factor) that is within five percent of a chi factor of said sample;
- inserting a calibration reference material in said inner tube;
- inserting said sample in said outer tube;
- performing calibration testing on said sample apparatus;
- removing said inner tube and calibration reference material after said step of performing calibration testing; and
- scanning said sample in said outer tube, after said step of removing, using NMR.

26. A method according to claim 25, wherein said calibration reference material is an organic salt.

27. A method according to claim 25, wherein said calibration reference material is tetramethylsilane.

28. A method of testing using nuclear magnetic resonance (NMR) in an NMR machine, comprising the steps of:
- (a) providing a sample apparatus which includes an inner sample tube and an outer sample tube; wherein said inner and outer sample tubes are made from a material selected from the group of polymeric materials which have a bulk magnetic susceptibility (chi factor) that is within five percent of a chi factor of said sample;
- (b) inserting a first sample material in said inner tube;
- (c) inserting a second sample material in said outer tube;
- (d) performing calibration testing on said sample apparatus using NMR;
- (e) removing, after said step of performing calibration testing, said first sample material from said inner tube and said second sample material from said second tube;
- (f) mixing said first and second sample materials;
- (g) inserting said mixed first and second sample materials into said inner and outer tubes; and
- (h) scanning said mixed sample materials using NMR;
- wherein said sample apparatus remains in said NMR machine at least during said steps (d), (e), (f), (g), and (h).

* * * * *